(12) United States Patent
Tanaka

(10) Patent No.: US 8,166,913 B2
(45) Date of Patent: May 1, 2012

(54) COATING TREATMENT METHOD, COMPUTER-READABLE STORAGE MEDIUM, AND COATING TREATMENT APPARATUS

(75) Inventor: Takashi Tanaka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1200 days.

(21) Appl. No.: 11/847,805

(22) Filed: Aug. 30, 2007

(65) Prior Publication Data

US 2008/0057194 A1 Mar. 6, 2008

(30) Foreign Application Priority Data

Sep. 1, 2006 (JP) .................. 2006-237694

(51) Int. Cl.
- B05C 11/00 (2006.01)
- B05C 11/02 (2006.01)
- B05B 3/00 (2006.01)
- B05B 7/06 (2006.01)

(52) U.S. Cl. ........ 118/712; 118/665; 118/667; 118/698; 118/680; 118/313; 118/315; 118/321; 118/323

(58) Field of Classification Search .................. 118/52, 118/612, 56, 319, 320, 313–315, 321, 323, 118/666, 667, 689, 712, 713, 665, 698, 679–681; 396/604, 611, 627; 427/240

See application file for complete search history.

(56) References Cited

U.S. PATENT DOCUMENTS

| | | | | |
|---|---|---|---|---|
| 5,939,139 A | * | 8/1999 | Fujimoto | ................. 427/240 |
| 6,447,632 B1 | * | 9/2002 | Shinozuka et al. | ......... 156/345.1 |
| 6,565,656 B2 | * | 5/2003 | Sada et al. | ..................... 118/50 |
| 2006/0040051 A1 | * | 2/2006 | Yamamoto et al. | ........... 427/240 |
| 2006/0280865 A1 | * | 12/2006 | Tateishi | ..................... 427/240 |

FOREIGN PATENT DOCUMENTS

| | | |
|---|---|---|
| JP | 11-260717 | 9/1999 |
| JP | 2001-198515 | 7/2001 |
| JP | 2001-307991 | 11/2001 |
| JP | 2003-209036 | 7/2003 |

OTHER PUBLICATIONS

Japanese Office Action issued Dec. 21, 2010, in Patent Application No. 2006-237694 (with English-language translation).

* cited by examiner

*Primary Examiner* — Yewebdar Tadesse
(74) *Attorney, Agent, or Firm* — Oblon, Spivak, McClelland, Maier & Neustadt, L.L.P.

(57) ABSTRACT

In the present invention, a substrate is first rotated at a first rotation speed, and a resist solution is applied to the rotated substrate. Subsequently, the rotation of the substrate is decelerated to a second rotation speed lower than the first rotation speed so that the substrate is rotated at the low speed to smooth the resist solution on the substrate. The rotation of the substrate is then accelerated to a third rotation speed higher than the second rotation speed, and a solvent for the coating solution and/or a dry gas are/is supplied to the resist solution on the substrate. In this event, the solvent gas is supplied to a portion of the resist solution on the substrate thicker than a set thickness, and the dry gas is supplied to a portion of the coating solution on the substrate thinner than the set thickness. This thins the thicker portion of the resist solution and thickens the thinner portion to uniform the resist solution.

6 Claims, 13 Drawing Sheets

COATING TREATMENT METHOD, COMPUTER-READABLE STORAGE MEDIUM, AND COATING TREATMENT APPARATUS

BACKGROUND OF THE INVENTION

1. Field of the Invention

The present invention relates to a coating treatment method, a computer-readable storage medium storing a program, and a coating treatment apparatus.

2. Description of the Related Art

In a photolithography process in manufacturing, for example, a semiconductor device, for example, a resist coating treatment for applying a resist solution onto a wafer to form a resist film, exposure processing for exposing the resist film into a predetermined pattern, and developing treatment for developing the exposed resist film are performed in sequence to form a predetermined resist pattern on the wafer.

In the above-described resist coating treatment, the wafer is rotated at a high speed, and a predetermined amount of the resist solution is supplied to the central portion of the rotated wafer and spread to the entire surface of the wafer by the centrifugal force. Subsequently, the rotation of the wafer is decelerated so that the resist solution on the wafer is smoothed at a low speed. Thereafter, the rotation speed of the wafer is increased so that the resist solution on the wafer is dried at a high speed for adjustment of film thickness, thereby forming a resist film with a predetermined thickness on the wafer (Japanese Patent Application Laid-open No. H11-260717).

However, the film thickness of the resist film determines whether the focus in the exposure processing is appropriate or not to affect the dimension of the final resist pattern, and therefore needs to be made uniform within the wafer. Conventionally, in the resist coating treatment, the film thickness of the resist film has been made uniform within the wafer by adjusting various parameters such as the temperature of the resist solution, the temperature of the wafer, the rotation speed of the wafer and so on. However, the adjustment of the above-described parameters cannot cope with local variations of the resist film within the wafer, failing to sufficiently uniform the resist film.

SUMMARY OF THE INVENTION

The present invention has been developed in consideration of the viewpoint, and its object is to form a uniform coating film within a substrate such as a wafer in the coating treatment of a coating solution such as a resist solution.

The present invention to achieve the above object is a substrate coating treatment method, including: a first step of rotating a substrate at a first rotation speed and applying a coating solution to the rotated substrate; a second step of decelerating the rotation of the substrate to a second rotation speed lower than the first rotation speed to rotate the substrate at the low speed; a third step of accelerating the rotation of the substrate to a third rotation speed higher than the second rotation speed, and supplying a solvent for the coating solution and/or a dry gas to the coating solution on the substrate; and a fourth step of accelerating the rotation of the substrate to a fourth rotation speed higher than the third rotation speed to dry the coating solution on the substrate. In the third step, the solvent for the coating solution is supplied to a portion of the coating solution on the substrate thicker than a set thickness determined in advance, and the dry gas is supplied to a portion of the coating solution on the substrate thinner than the set thickness. Note that the "set thickness" may be one having an allowable range.

According to the present invention, the solvent can be supplied to the thick portion of the coating solution at the third step to increase the flowability of the coating solution at the thick portion to thereby reduce the thickness of the coating solution of that portion. On the other hand, the dry gas can be supplied to the thin portion of the coating solution to decrease the flowability of the thin portion to thereby increase the thickness of the coating solution at that portion. As a result, a uniform coating film can be finally formed within the substrate.

According to another aspect, the present invention is a computer-readable storage medium storing a program, wherein said program functions in a control unit to cause a coating treatment apparatus to perform the above-described coating treatment method.

According to still another aspect, the present invention is a substrate coating treatment apparatus, including a rotary holding unit for holding and rotating a substrate; a first nozzle for supplying a coating solution onto the substrate; a second nozzle for selectively supplying a solvent for the coating solution and a dry gas onto the substrate; and a moving mechanism for moving the second nozzle to a predetermined position above the substrate.

According to the present invention, since a uniform coating film can be formed on a substrate, the yields of final substrate products can be improved.

DETAILED DESCRIPTION OF THE INVENTION

Figure 1:
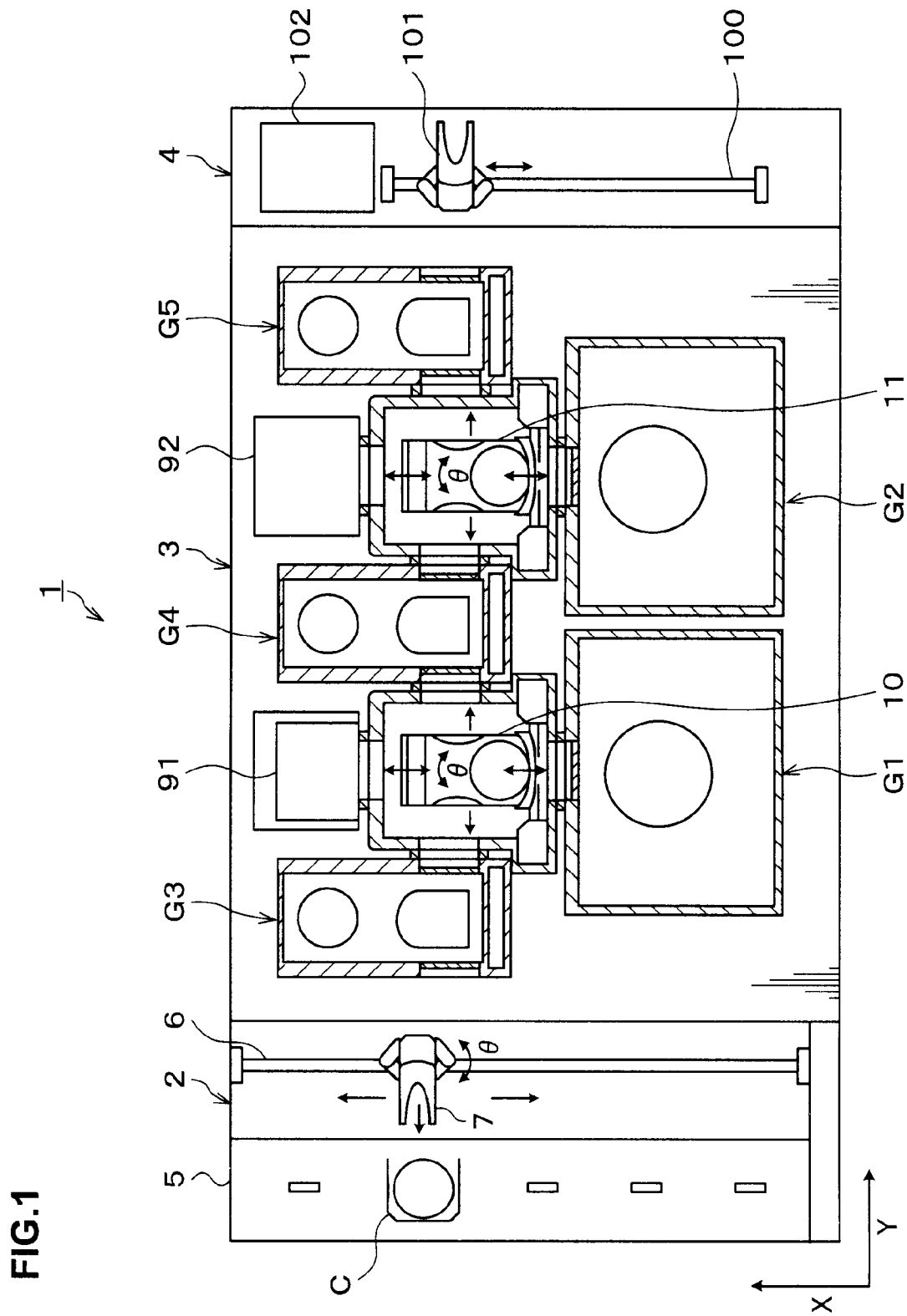
FIG. 1 is a plan view showing the outline of a configuration of a coating and developing treatment system in a present embodiment.
Figure 2:
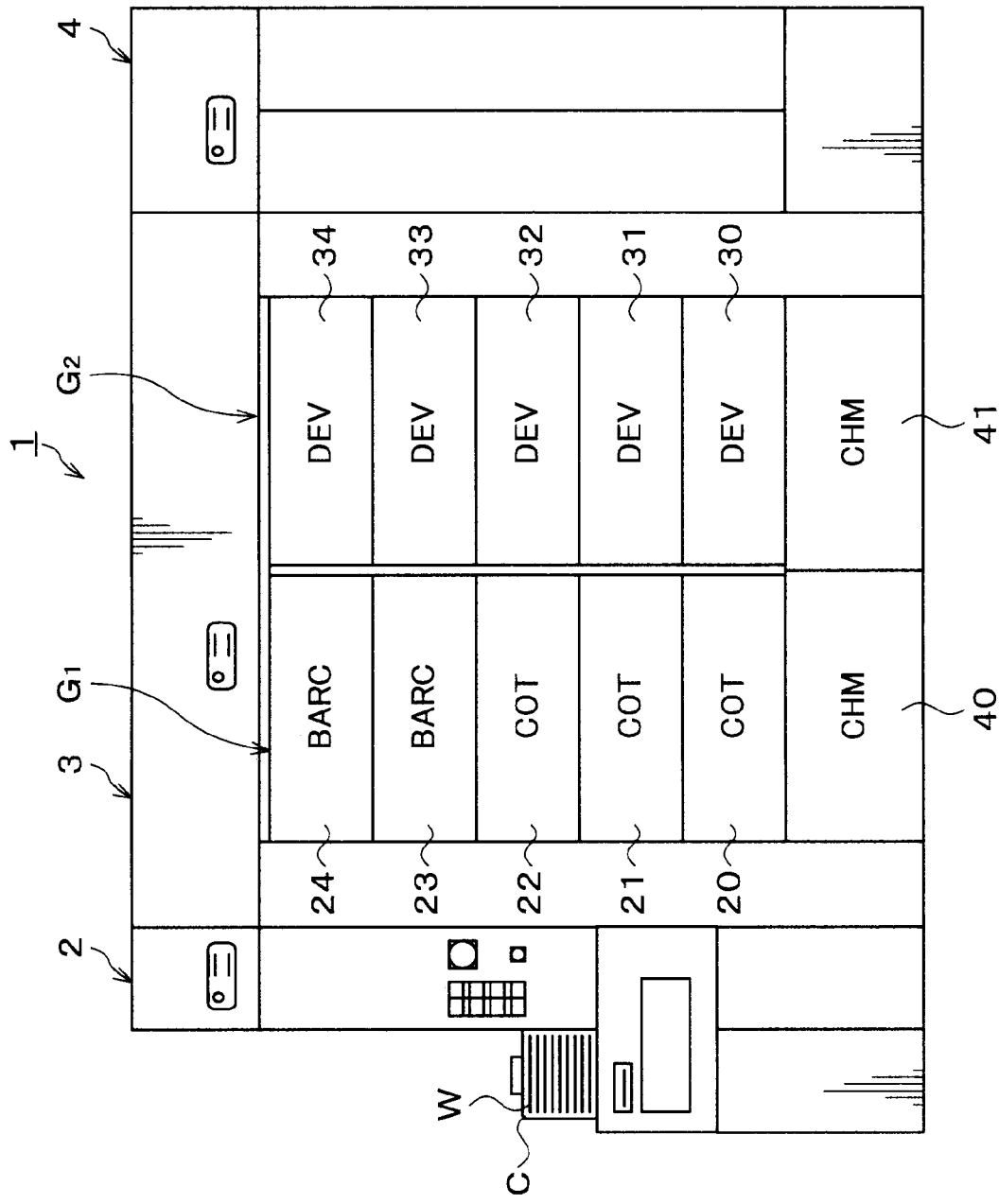
FIG. 2 is a front view of the coating and developing treatment system in FIG. 1.
Figure 3:
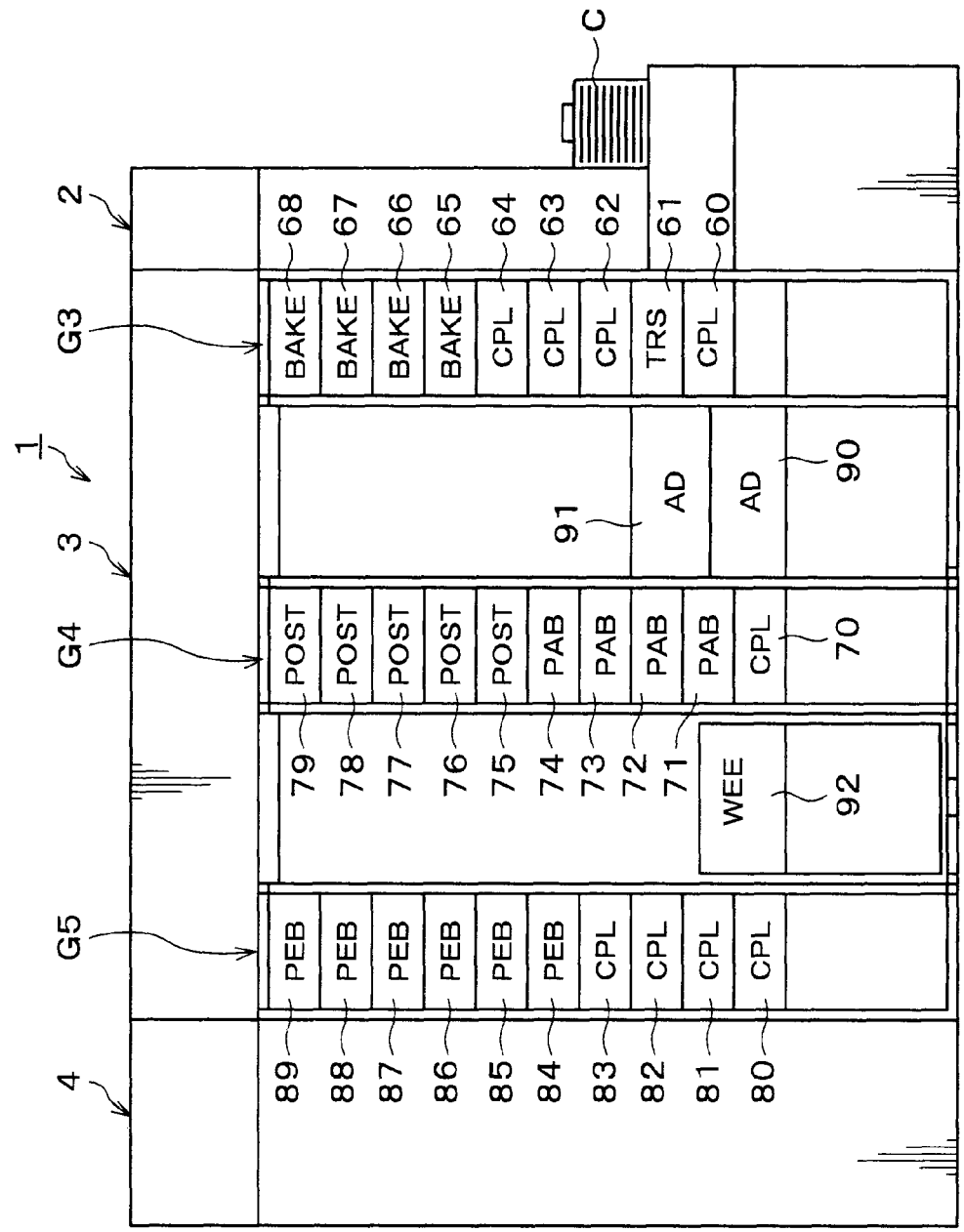
FIG. 3 is a rear view of the coating and developing treatment system in FIG. 1.

Hereinafter, a preferred embodiment of the present invention will be described. FIG. 1 is a plan view showing the outline of a configuration of a coating and developing treatment system 1 incorporating a coating treatment apparatus according to the embodiment, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for transferring a plurality of wafers W per cassette as a unit from/to the outside into/from the coating and developing treatment system 1 and transferring the wafers W into/out of a cassette C; a processing station 3 including a plurality of various kinds of processing and treatment units, which are multi-tiered, for performing predetermined processing or treatment in a manner of single wafer processing in the photolithography process; and an interface station 4 for delivering the wafers W to/from an aligner (not shown) provided adjacent to the processing station 3, are integrally connected together.

In the cassette station 2, a cassette mounting table 5 is provided and configured such that a plurality of cassettes C can be mounted thereon in a line in an X-direction (a top-to-bottom direction in FIG. 1). In the cassette station 2, a wafer transfer body 7 is provided which is movable in the X-direction on a transfer path 6. The wafer transfer body 7 is also movable in a wafer-arrangement direction of the wafers W housed in the cassette C (a Z-direction; the vertical direction), and thus can selectively access the plurality of wafers W in each of the cassettes C. The wafer transfer body 7 is rotatable around an axis in the vertical direction (a θ-direction), and can access the processing and treatment units included in a later-described third processing unit group G3 on the processing station 3 side.

The processing station 3 includes, for example, five processing unit groups G1 to G5 in each of which a plurality of processing and treatment units are multi-tiered. On the side of the negative direction in the X-direction (the downward direction in FIG. 1) in the processing station 3, the first processing unit group G1 and the second processing unit group G2 are placed in order from the cassette station 2 side. On the side of the positive direction in the X-direction (the upward direction in FIG. 1) in the processing station 3, the third processing unit group G3, the fourth processing unit group G4, and the fifth processing unit group G5 are placed in order from the cassette station 2 side. Between the third processing unit group G3 and the fourth processing unit group G4, a first transfer unit 10 is provided. The first transfer unit 10 can selectively access the processing and treatment units in the first processing unit group G1, the third processing unit group G3, and the fourth processing unit group G4 and transfer the wafer W to them. Between the fourth processing unit group G4 and the fifth processing unit group G5, a second transfer unit 11 is provided. The second transfer unit 11 can selectively access the processing and treatment units in the second processing unit group G2, the fourth processing unit group G4, and the fifth processing unit group G5 and transfer the wafer W to them.

In the first processing unit group G1, as shown in FIG. 2, solution treatment units each for supplying a predetermined liquid to the wafer W to perform treatment, for example, resist coating units 20, 21, and 22 as the coating treatment apparatuses according to this embodiment, and bottom coating units 23 and 24 each for forming an anti-reflection film that prevents reflection of light at the time of exposure processing, are five-tiered in order from the bottom. In the second processing unit group G2, solution treatment units, for example, developing treatment units 30 to 34 each for supplying a developing solution to the wafer W to develop it are five-tiered in order from the bottom. Further, chemical chambers 40 and 41 for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, for example, a temperature regulating unit 60, a transition unit 61 for passing the wafer W, high-precision temperature regulating units 62 to 64 each for regulating the wafer temperature under a high precision temperature control, and heat processing units 65 to 68 each for heat-processing the wafer W at a high temperature, are nine-tiered in order from the bottom.

In the fourth processing unit group G4, for example, a high-precision temperature regulating unit 70, pre-baking units 71 to 74 each for heat-processing the wafer W after resist coating treatment, and post-baking units 75 to 79 each for heat-processing the wafer W after developing treatment, are ten-tiered in order from the bottom.

In the fifth processing unit group G5, a plurality of heat processing units each for heat-processing the wafer W, for example, high-precision temperature regulating units 80 to 83, and post-exposure baking units 84 to 89, are ten-tiered in order from the bottom.

As shown in FIG. 1, on the positive direction side in the X-direction of the first transfer unit 10, a plurality of processing and treatment units are arranged, for example, adhesion units 90 and 91 each for performing hydrophobic treatment on the wafer W being two-tiered in order from the bottom as shown in FIG. 3. As shown in FIG. 1, on the positive side in the X-direction of the second transfer unit 11, for example, an edge exposure unit 92 is disposed which selectively exposes only the edge portion of the wafer W to light.

In the interface station 4, for example, a wafer transfer body 101 moving on a transfer path 100 extending in the X-direction and a buffer cassette 102 are provided as shown in FIG. 1. The wafer transfer body 101 is movable in the Z-direction and also rotatable in the θ-direction, and thus can access the not-shown aligner adjacent to the interface station 4, the buffer cassette 102, and the fifth processing unit group G5 and transfer the wafer W to them.

Figure 4:
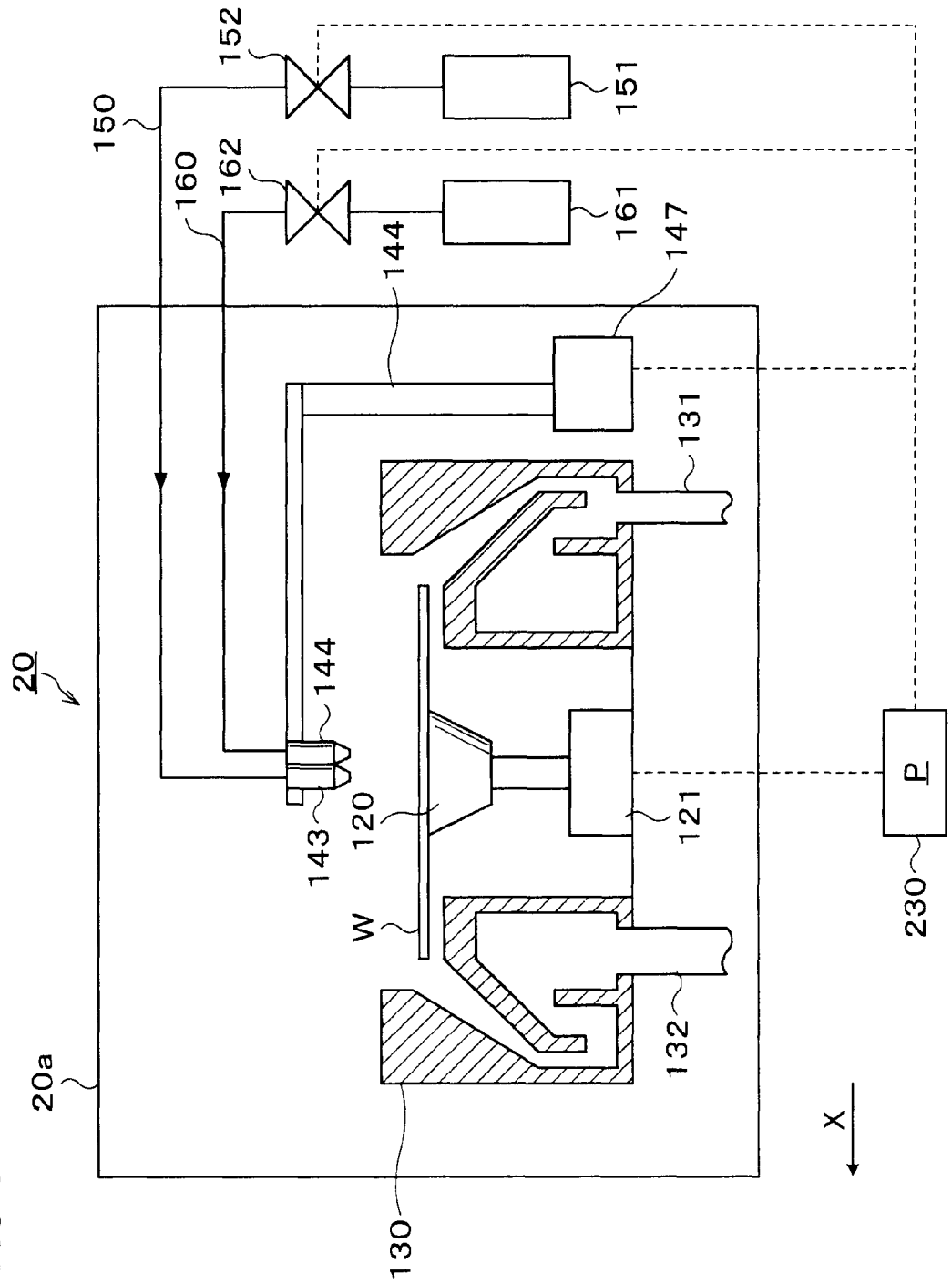
FIG. 4 is an explanatory view of a vertical section showing the outline of the configuration of a resist coating unit when a first arm is located above a wafer.
Figure 5:
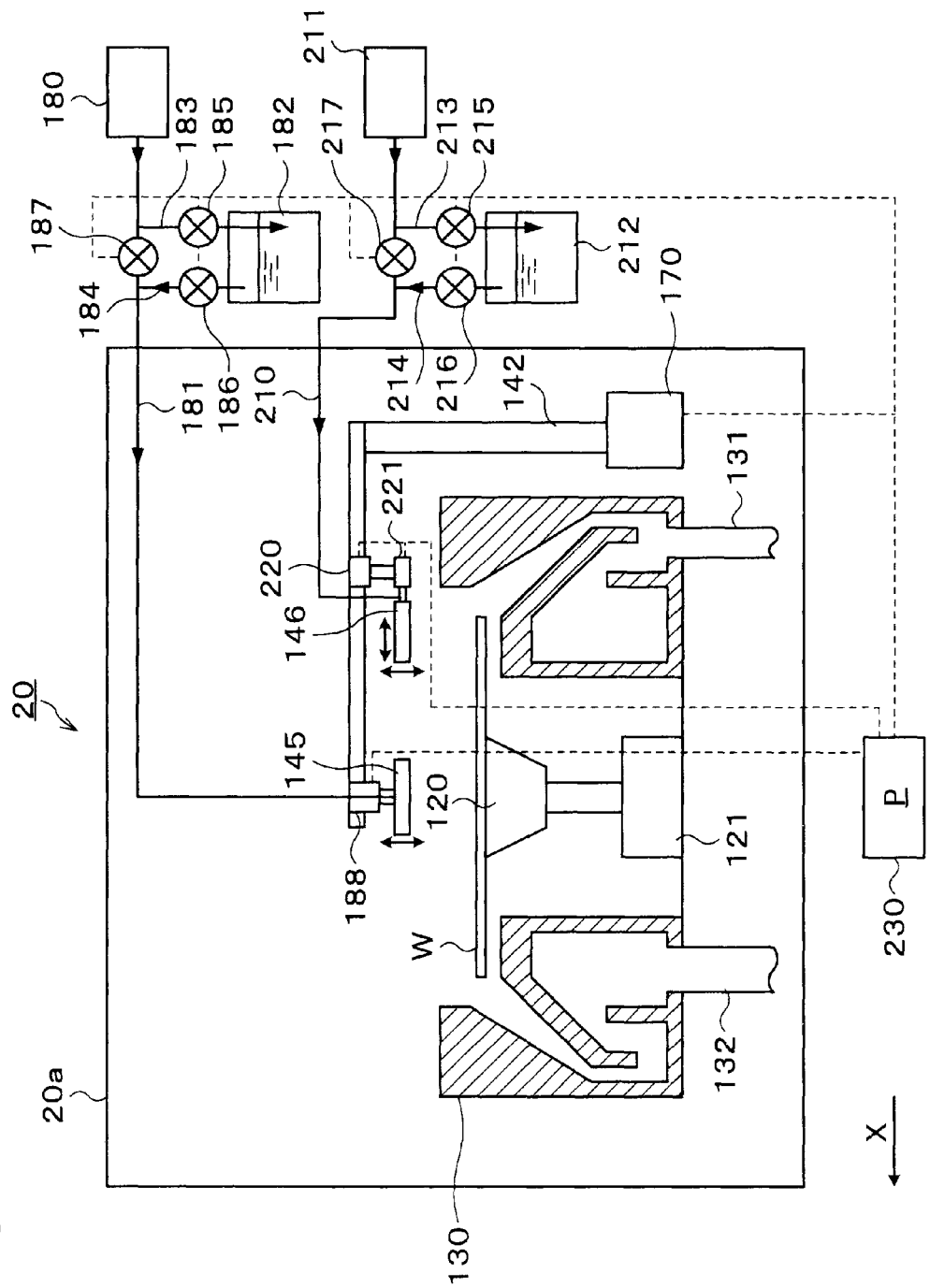
FIG. 5 is an explanatory view of a vertical section showing the outline of the configuration of the resist coating unit when a second arm is located above the wafer.

Next, the configuration of the above-described resist coating units 20 to 22 will be described in detail. FIG. 4 and FIG. 5 are explanatory view of vertical sections showing the outline of the configuration of the resist coating unit 20, and FIG. 6 is a plan view showing the outline of the configuration of the resist coating unit 20.

As shown in FIG. 4, the resist coating unit 20 has a casing 20a, and a spin chuck 120 as a rotary holding member for holding and rotating the wafer W is provided in the casing 20a. The spin chuck 120 has a horizontal upper surface which is provided with, for example, a suction port (not shown) for sucking the wafer W. Suction from the suction port allows the wafer W to be sucked onto the spin chuck 120. The spin chuck 120 can rotate the wafer W at a predetermined speed by a rotary drive unit 121 such as a motor contained in the spin chuck 120.

Around the spin chuck 120, a cup 130 is provided for receiving and collecting liquids such as the resist solution scattering from the wafer W. The cup 130 is formed in an almost cylindrical shape with its bottom face closed. The bottom portion of the cup 130 is provided with a drain pipe 131 for draining the collected resist solution and the like and an exhaust pipe 132 for exhausting the atmosphere in the cup 130.

Figure 6:
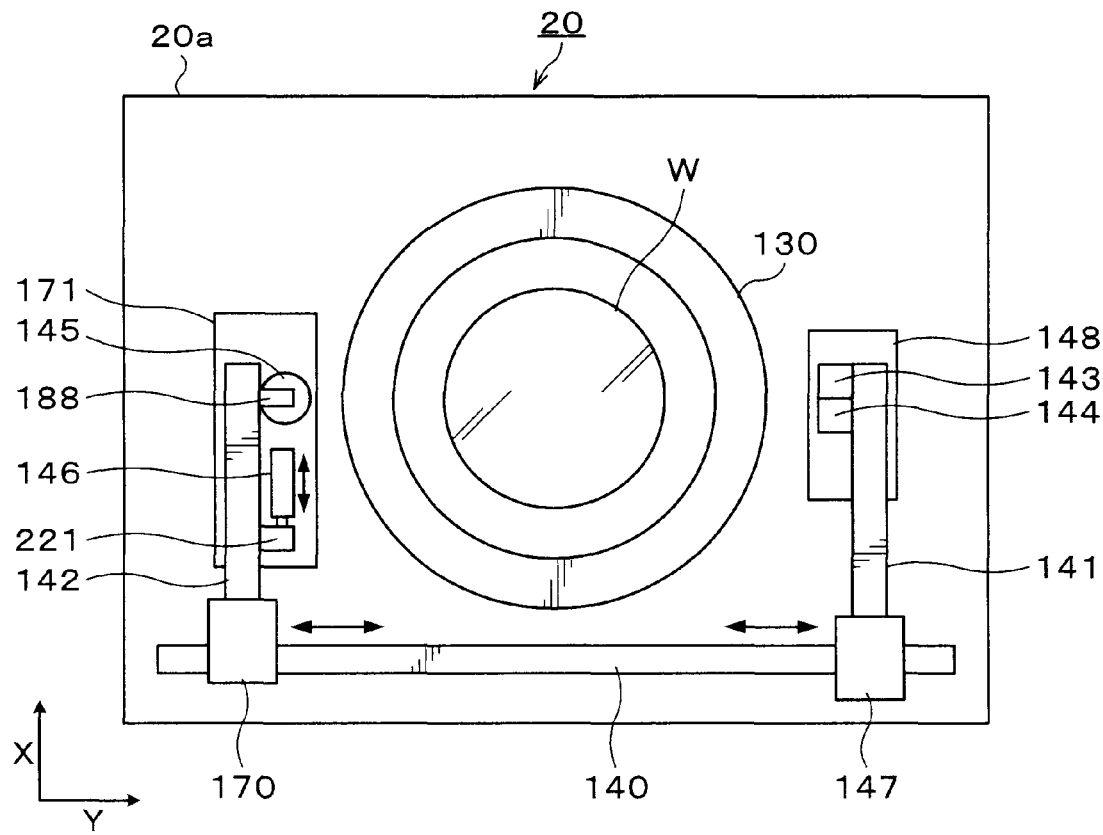
FIG. 6 is a plan view showing the outline of the configuration of the resist coating unit.

As shown in FIG. 6, a rail 140 extending along the Y-direction (the right-to-left direction) is formed, for example, on the negative direction side in the X-direction (the lower direction in FIG. 6) of the cup 130. The rail 140 is formed, for example, from the outside of the cup 130 on the negative direction side in the Y-direction (the left direction in FIG. 6) to outside of the cup 130 on the positive direction side in the Y-direction (the right direction in FIG. 6). On the rail 140, for example, two arms 141 and 142 are provided which extend in the X-direction. On the first arm 141, a resist solution supply nozzle 143 and a pre-wetting nozzle 144 are supported as a first nozzle. On the second arm 142, a central portion supply nozzle 145 and an outer peripheral portion supply nozzle 146 are supported as a second nozzle.

The first arm 141 can move on the rail 140, for example, by means of a drive unit 147 such as a motor, to move the resist solution supply nozzle 143 and the pre-wetting nozzle 144 from a waiting section 148 provided outside the cup 130 to positions above the wafer W in the cup 130. The first arm 141 is movable in the vertical direction, for example, by means of the drive unit 147 and capable of raising and lowering the resist solution supply nozzle 143 and the pre-wetting nozzle 144.

The resist solution supply nozzle 143 is in communication with a resist solution supply source 151, for example, via a supply pipe 150 as shown in FIG. 4. The supply pipe 150 is provided with a valve 152 so that the opening/closing operation of the valve 152 allows for discharge of the resist solution from the resist solution supply nozzle 143 at a predetermined timing.

The pre-wetting nozzle 144 is in communication with a solvent supply source 161, for example, via a supply pipe 160. The supply pipe 160 is provided with a valve 162 so that the opening/closing operation of the valve 162 allows for discharge of the solvent for the resist solution from the pre-wetting nozzle 144 at a predetermined timing.

The second arm 142 can move on the rail 140, for example, by means of a drive unit 170 such as a motor as shown in FIG. 6, to move the central portion supply nozzle 145 and the outer peripheral portion supply nozzle 146 from a waiting section 171 provided outside the cup 130 to positions above the wafer W in the cup 130.

Figure 7:
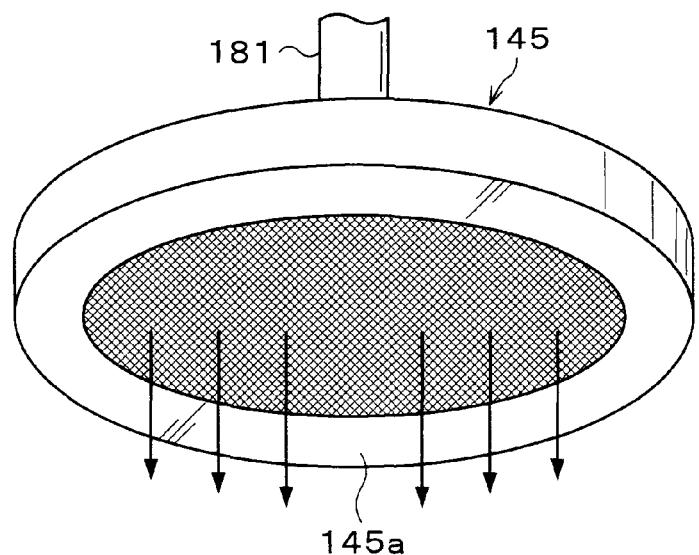
FIG. 7 is a perspective view of a central portion supply nozzle.

The central portion supply nozzle 145 is supported on a tip portion in the longitudinal direction (the X-direction) of the second arm 142 and can be moved by the second arm 142 to a position above the central portion of the wafer W in the cup 130. The central portion supply nozzle 145 is formed, for example, in a disk shape as shown in FIG. 7. The central portion supply nozzle 145 has a cylindrical hollow portion (not shown) therein, and its lower surface is formed with a supply port 145a in a mesh form leading to the hollow portion. To the upper portion of the central portion supply nozzle 145, a supply pipe 181 is connected which leads to a dry gas supply source 180 shown in FIG. 5 from the hollow portion therein. In this embodiment, for example, a dry air, a dry $N_2$ gas, a Ne gas is used as the dry gas.

To the supply pipe 181, two branch pipes 183 and 184 are connected which lead to a solvent storage unit 182 in which, for example, a liquid solvent for the resist solution is stored. The branch pipes 183 and 184 are provided with valves 185 and 186, respectively. A valve 187 is provided along the supply pipe 181 between the branch pipe 183 and the branch pipe 184. By closing the valves 185 and 186 and opening the valve 187, the dry gas can be supplied from the dry gas supply source 180 to the central portion supply nozzle 145 and discharged from the supply port 145a of the central portion supply nozzle 145. By opening the valves 185 and 186 and closing the valve 187, the dry gas in the dry gas supply source 180 can be supplied to the solvent storage unit 182 so that the dry gas can be introduced into the liquid solvent to absorb the solvent to produce a solvent gas in the solvent storage unit 182. The produced solvent gas is returned into the supply pipe 181 and supplied to the central portion supply nozzle 145 and can be discharged from the supply port 145a of the central portion supply nozzle 145. With this configuration, the central portion supply nozzle 145 can selectively discharge the dry gas and the solvent gas.

As the solvent used for the solvent gas, solvents for the resist, SOD, and SOG or organic solvents that can be solvents for them can be used, and examples thereof include, for example, ketones, esters, alcohols, glycol ethers, carbon hydrides, more specifically, acetone, IPA, PGMEA, and NMP.

The central portion supply nozzle 145 is attached to the second arm 142, for example, via a raising and lowering drive unit 188 such as a cylinder and can be raised and lowered to a predetermined height.

The outer peripheral portion supply nozzle 146 is supported on the second arm 142 near its central portion in the longitudinal direction and can be moved by the second arm 142 to a position above the outer peripheral portion of the wafer W. Note that in this embodiment, for example, the second arm 142 and the drive unit 170 constitute the moving mechanism for the central portion supply nozzle 145 and the outer peripheral portion supply nozzle 146.

Figure 8:
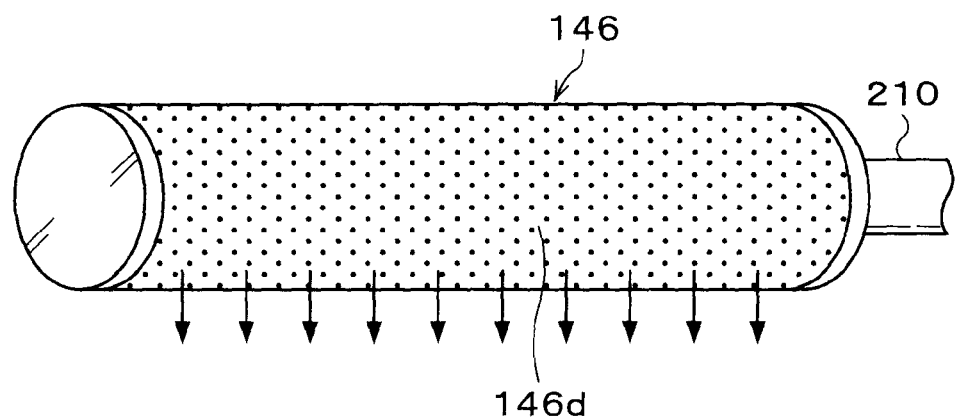
FIG. 8 is a perspective view of an outer peripheral portion supply nozzle.
Figure 9:
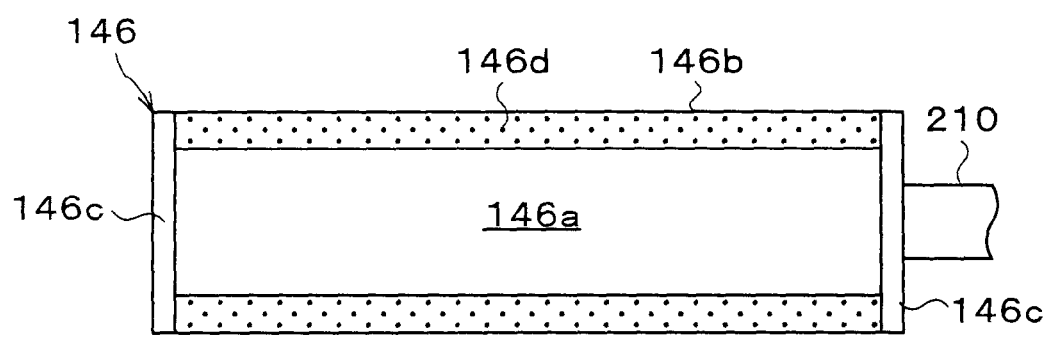
FIG. 9 is a vertical-sectional view of the outer peripheral portion supply nozzle.

The outer peripheral portion supply nozzle 146 is a so-called break filter and has an outer shape formed in a cylindrical shape as shown in FIG. 8. The outer peripheral portion supply nozzle 146 includes, as shown in FIG. 9, for example, a cylindrical portion 146b having a hollow portion 146a therein and a sealing plate 146c in a disk shape attached to both end portions of the cylindrical portion 146b to seal the hollow portion 146a. The cylindrical portion 146b is made of, for example, a porous ceramic, and the circumferential surface being the surface of the cylindrical portion 146b is formed with a number of fine supply ports 146d over the entire circumference. The supply ports 146d are in communication with the inside hollow portion 146a. To one end of the hollow portion 146a, a supply pipe 210 is connected.

The supply pipe 210 is in communication with a dry gas supply source 211 as shown in FIG. 5. To the supply pipe 210, two branch pipes 213 and 214 are connected which lead to a solvent storage unit 212 in which, for example, a liquid solvent for the resist solution is stored. The branch pipes 213 and 214 are provided with valves 215 and 216, respectively. A valve 217 is provided along the supply pipe 210 between the branch pipe 213 and the branch pipe 214. By closing the valves 215 and 216 and opening the valve 217, the dry gas can be supplied from the dry gas supply source 211 to the outer peripheral portion supply nozzle 146 and discharged from the supply port 146d of the outer peripheral portion supply nozzle 146. By opening the valves 215 and 216 and closing the valve 217, the dry gas can be supplied to the solvent storage unit 212 so that the dry gas can be introduced into the liquid solvent to absorb the solvent to produce a solvent gas in the solvent storage unit 212. The produced solvent gas is returned into the supply pipe 210 and supplied to the outer peripheral portion supply nozzle 146 and can be discharged from the supply port 146*d* of the outer peripheral portion supply nozzle 146. With this configuration, the outer peripheral portion supply nozzle 146 can selectively discharge the dry gas and the solvent vapor.

The outer peripheral portion supply nozzle 146 is attached to the second arm 142, for example, via a raising and lowering drive unit 220 such as a cylinder and can be raised and lowered to a predetermined height. The outer peripheral portion supply nozzle 146 is also attached to the second arm 142 via a horizontal drive unit 221 such as a cylinder and can be moved along the longitudinal direction (the X-direction) of the second arm 142.

The control of the rotary drive operation of the above-described spin chuck 120, the opening/closing operations of the valves 152, 162, 185, 186, 187, 215, 216, and 217, and the operations of the drive system such as the drive unit 147 for the first arm 141, the drive unit 170 for the second arm 142, the raising and lowering drive unit 188 for the central portion supply nozzle 145, and the raising and lowering drive unit 220 and the horizontal drive unit 221 for the outer peripheral portion supply nozzle 146 are conducted by a control unit 230. The control unit 230 is composed, for example, of a general-purpose computer, and can realize a later-described coating treatment method by executing a program P recorded, for example, in a memory to control the operation of the spin chuck 120 and so on. Note that the program P for realizing the coating treatment in this embodiment may be one installed in the control unit 230 by various kinds of computer-readable storage media.

The configurations of the resist coating units 21 and 22 are the same as that of the above-described resist coating unit 20, and therefore description thereof will be omitted.

Next, the coating treatment process performed in the resist coating unit 20 configured as described above will be described in conjunction with the process of the wafer processing performed in the whole coating and developing treatment system 1.

First of all, unprocessed wafers W are taken out of the cassette C on the cassette mounting table 5 one by one by the wafer transfer body 7 shown in FIG. 1 and transferred in sequence to the processing station 3. The wafer W is transferred to the temperature regulating unit 60 included in the third processing unit group G3 and temperature-regulated to a predetermined temperature. The wafer W is then transferred by the first transfer unit 10 into the bottom coating unit 23, where an anti-reflection film is formed. The wafer W is then transferred by the first transfer unit 10, for example, to the heat processing unit 65 and the high-precision temperature regulating unit 70 in sequence so that predetermined processing is performed in each of the units. Thereafter, the wafer W is transferred by the first transfer unit 10, for example, to the resist coating unit 20.

Figure 10:
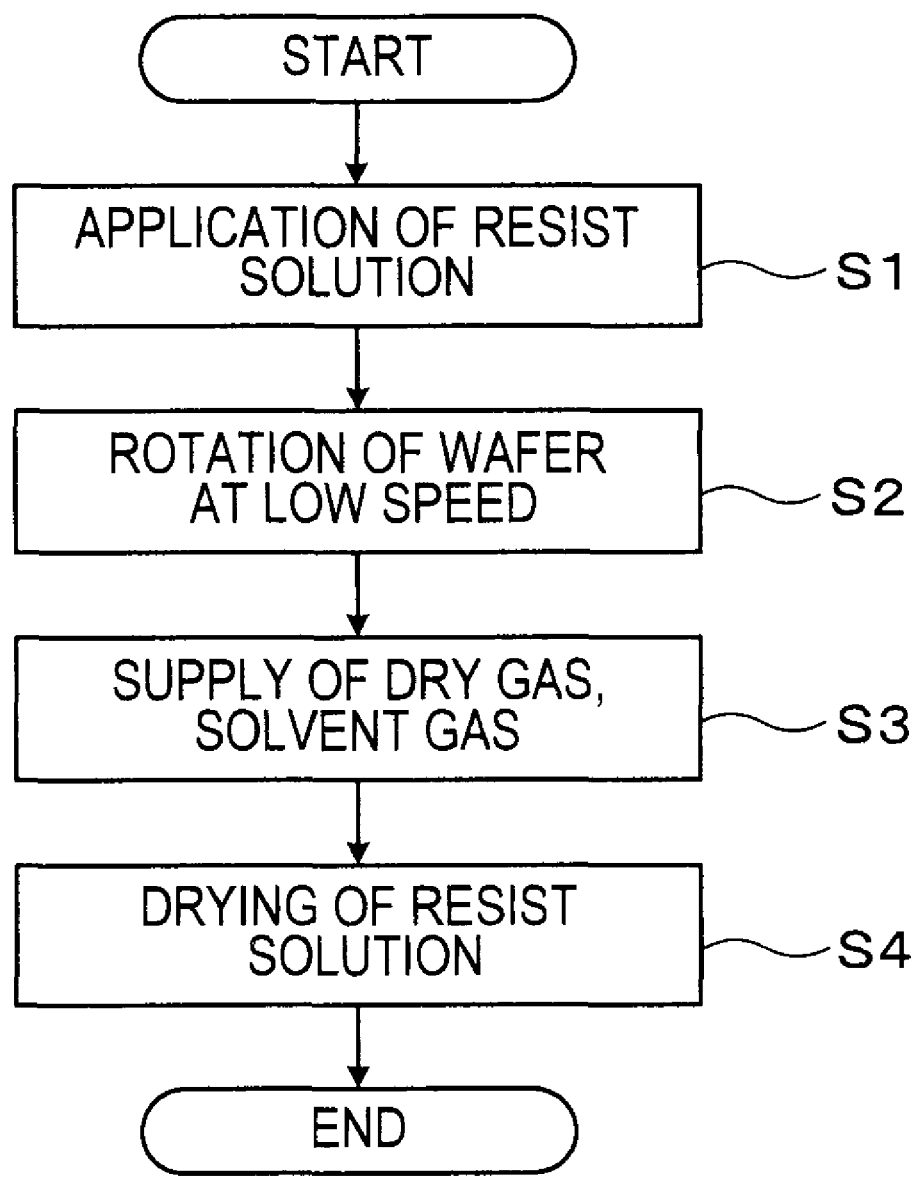
FIG. 10 is a flowchart showing the process of the resist coating treatment.
Figure 11:
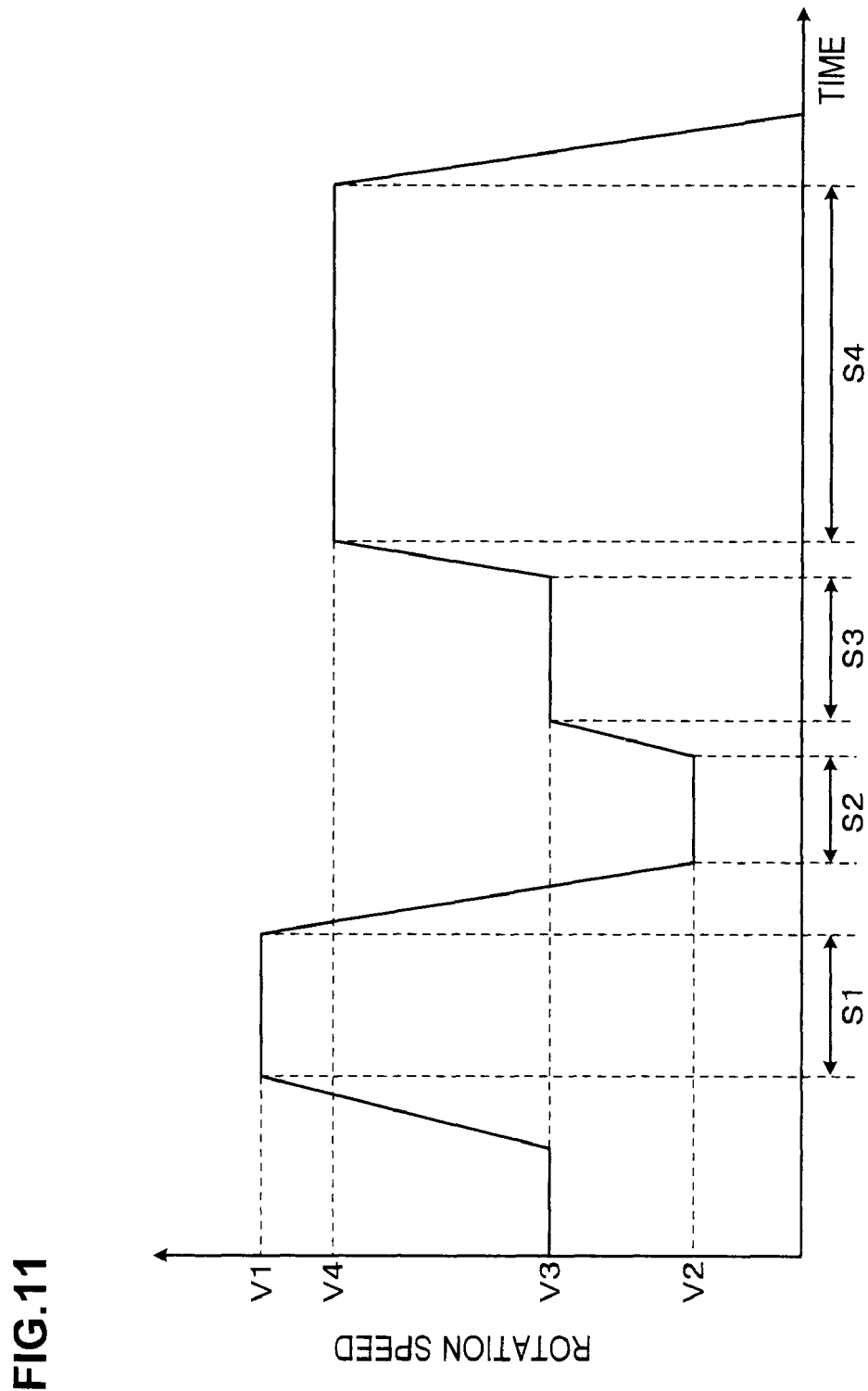
FIG. 11 is a graph showing changes in rotation speed of the wafer in the resist coating treatment.

FIG. 10 is a flowchart showing main steps of the coating treatment process in the resist coating unit 20. FIG. 11 is a graph showing changes in rotation speed of the wafer W in the coating treatment process. The wafer W transferred into the resist coating unit 20 is first suction-held on the spin chuck 120. Subsequently, the pre-wetting nozzle 144 and the resist solution supply nozzle 143 at the waiting section 148 are moved by the first arm 141 to the positions above the central portion of the wafer W, and the wafer W is rotated by the spin chuck 120. The solvent for pre-wetting is supplied from the pre-wetting nozzle 144 onto the rotated wafer W, whereby the solvent is applied on the wafer W.

Subsequently, as shown in FIG. 11, the rotation of the wafer W is accelerated to a first speed V1 of, for example, about 3000 rpm that is high speed, and a predetermined amount of resist solution is supplied from the resist supply nozzle 143 onto the central portion of the wafer W rotated at the high speed. The resist solution supplied on the wafer W is spread over the entire surface of the wafer W by the centrifugal force so that the resist solution is applied on the wafer W (step S1 in FIG. 10). The resist solution supply nozzle 143 completed the supply of the resist solution is returned to the waiting section 148. When the application of the resist solution is completed, the rotation of the wafer W is decelerated to a second rotation speed V2 of about 100 rpm that is low speed (step S2 in FIG. 10). The rotation at the low speed allows the resist solution on the wafer W to flow to smooth.

The rotation of the wafer is then accelerated to a third rotation speed, for example, of about 500 rpm. In this event, the central portion supply nozzle 145 and the outer peripheral portion supply nozzle 146 are moved by the second arm 142 to positions above the radius of the wafer W, and the dry gas and/or the solvent gas are/is supplied from at least any one of the central portion supply nozzle 145 and the outer peripheral portion supply nozzle 146 to predetermined portions or a predetermined portion of the resist solution on the wafer W (step S3 in FIG. 10).

The necessity of supply and the supply positions of the dry gas and the solvent gas are determined according to the thickness of the resist solution on the wafer W. For example, within the wafer, the solvent gas for increasing the flowability of the resist solution is supplied to a portion with a thickness of the resist solution greater than a set thickness determined in advance, while the dry gas for decreasing the flowability of the resist solution is supplied to a portion with a thickness smaller than the set thickness.

Figure 12:
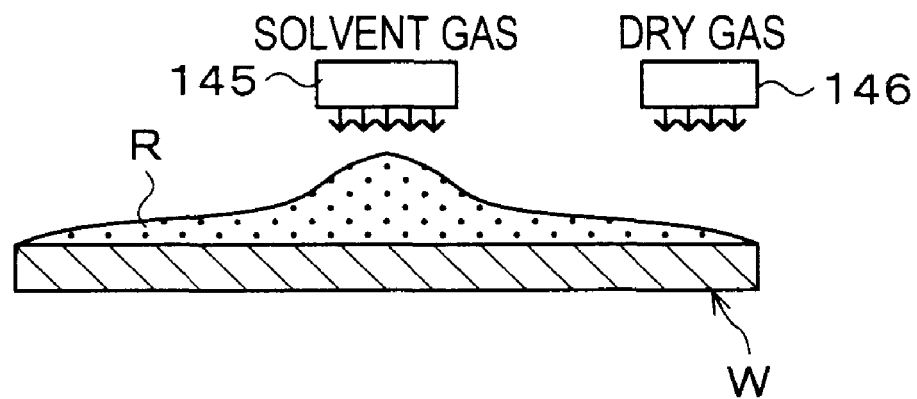
FIG. 12 is a vertical-sectional view of the wafer showing a state in which the resist solution at the central portion rises up.

For example, as shown in FIG. 12, if a resist solution R on the central portion of the wafer W is thicker than the set thickness, the solvent gas is supplied to the central portion of the wafer W from the central portion supply nozzle 145. If the resist solution R on the outer peripheral portion of the wafer W is thinner than the set thickness, the dry gas is supplied to the outer peripheral portion of the wafer W from the outer peripheral portion supply nozzle 146. In this event, the outer peripheral portion supply nozzle 146 is horizontally moved to a position above the portion where the thickness of the resist solution R is smaller on the radius of the wafer W and supplied the dry gas thereto. The central portion supply nozzle 145 and the outer peripheral portion supply nozzle 146 are adjusted in height and brought closer to the wafer W before they supply the solvent gas or the dry gas.

Figure 13:
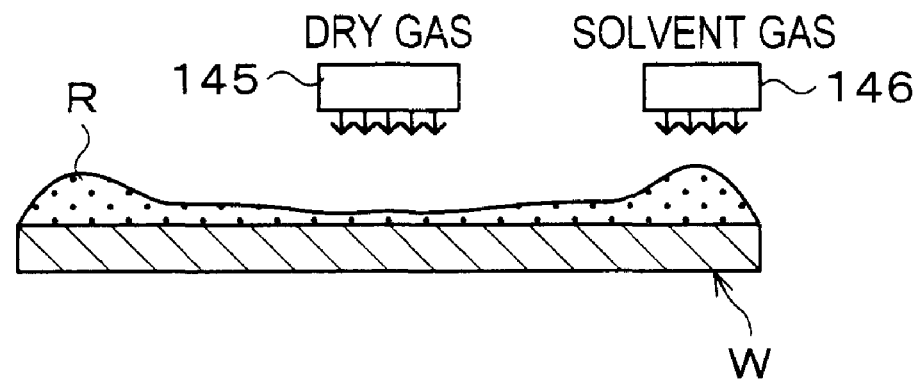
FIG. 13 is a vertical-sectional view of the wafer showing a state in which the resist solution at the outer peripheral portion rises up.

For example, as shown in FIG. 13, if the resist solution R on the outer peripheral portion of the wafer W is thicker than the set thickness, the solvent gas is supplied from the outer peripheral portion supply nozzle 146 to the outer peripheral portion of the wafer W. If the resist solution R on the central portion of the wafer W is thinner than the set thickness, the dry gas is supplied from the central portion supply nozzle 145 to the central portion of the wafer W. Note that the thickness of the resist solution within the wafer is grasped from the test which has been performed in advance for each recipe for the wafer processing, so that the necessity of supply and the supply positions of the dry gas and the solvent gas are set based on the thickness.

As described above, when the solvent gas is supplied to the portion where the resist solution is thicker than the set thickness, the flowability of the resist solution at that portion increases, so that the resist solution at that thicker portion flows to other portions by the rotation force of the wafer W, resulting in a reduced thickness of the resist solution at that portion. Besides, when the dry gas is supplied to the portion where the resist solution is thinner than the set thickness, the flowability of the resist solution at that portion decreases, so that the resist solution at other portions flows into that thinner portion by the rotation force of the wafer W, resulting in a increased thickness of the resist solution at that portion. Thus, local projections and depressions of the resist solution within the wafer are removed.

Next, the rotation of the wafer W is accelerated, for example, to a fourth rotation speed V4 of about 2000 rpm so that the entire thickness of the resist solution is adjusted, while the resist solution on the wafer W is being dried (step S4 in FIG. 10). Subsequently, the rotation of the wafer W is stopped, with which a series of coating treatments ends. Note that the series of coating treatments is realized, for example, by the control unit 230 executing the program P to control the rotary drive operation of the spin chuck 120, the opening/closing operations of the valves 152, 162, 185, 186, 187, 215, 216, and 217, the drive unit 147 for the first arm 141, the drive unit 170 for the second arm 142, the raising and lowering drive unit 188 for the central portion supply nozzle 145, the raising and lowering drive unit 220 and the horizontal drive unit 221 for the outer peripheral portion supply nozzle 146, the resist solution supply nozzle 143, the pre-wetting nozzle 144, the central portion supply nozzle 145, the outer peripheral portion supply nozzle 146 and so on.

The wafer W on which the resist film has been formed is transferred by the first transfer unit 10 to the pre-baking unit 71 and subjected to pre-baking processing. The wafer W is subsequently transferred by the second transfer unit 11 to the edge exposure unit 91 and the high-precision temperature regulating unit 83 in sequence so that the wafer W is subjected to predetermined processing in each of the units. Thereafter, the wafer W is transferred by the wafer transfer body 101 in the interface station 4 to the aligner (not shown) and exposed to light. The wafer W for which exposure processing has been finished is transferred by the wafer transfer body 101, for example, to the post-exposure baking unit 84, where the wafer W is subjected to post-exposure baking, and then transferred by the second transfer unit 11 to the high-precision temperature regulating unit 81, where the wafer W is temperature-regulated. The wafer W is then transferred to the developing treatment unit 30, where the resist film on the wafer W is developed. The wafer W for which developing treatment has been finished is transferred, for example, by the second transfer unit 11 to the post-baking unit 75, where the wafer W is subjected to post-baking processing. Subsequently, the wafer W is then transferred to the high-precision temperature regulating unit 63, where the wafer W is temperature-regulated. The wafer W is then transferred by the first transfer unit 10 to the transition unit 61, and returned by the wafer transfer body 7 to the cassette C. Thus, a series of wafer processing ends.

According to the above embodiment, since the wafer W is rotated at the third rotation speed V3 and the dry gas or the solvent gas is supplied to a part of the resist solution on the wafer W before the resist solution on the wafer W is dried at the fourth speed V4, the local projections and depressions of the resist solution can be removed to eliminate variations in thickness of the resist solution. As a result, a uniform resist film can be formed within the wafer.

Further, the two nozzles, that is, the central portion supply nozzle 145 and the outer peripheral portion supply nozzle 146 are used to supply the dry gas or the solvent gas to the central portion of the wafer W and the outer peripheral portion therearound, thus ensuring that, for example, the dry gas can be supplied to the outer peripheral portion of the wafer W, while the solvent gas is being supplied to the central portion of the wafer W to preferably correct the variations in thickness of the resist solution within the wafer. Further, the nozzles 145 and 146 are configured to be able to selectively supply the dry gas and the solvent gas so that each of the nozzles can cope with both cases when the thickness of the resist solution is large and the case when it is small.

Further, the outer peripheral portion supply nozzle 146 is configured to be able to horizontally move along the direction of the radius of the wafer W so as to supply the dry gas or the solvent gas to a desired portion on the radius of the wafer W. As a result, even when projections and depressions of the resist solution appear in any part on the radius of the wafer W, they can be appropriately coped with.

The central portion supply nozzle 145 is formed in a disk shape and its lower surface is formed with the supply port 145a in a mesh form and therefore can appropriately supply the dry gas or the solvent gas to the central portion of the wafer W. The outer peripheral portion supply nozzle 146 is a so-called break filter made of a porous material that jets gas from the fine supply ports 146d and therefore can appropriately supply the dry gas or the solvent gas only to a portion on the wafer W. This can locally correct the thickness of the resist solution on the wafer W.

Although the thickness of the resist solution and the variation tendency are grasped in advance so that the necessity of supply and the supply positions of the dry gas and the solvent gas by the central portion supply nozzle 145 and the outer peripheral portion supply nozzle 146 are sequentially controlled based on the variation tendency in the above embodiment, the thickness of the resist solution within the wafer may be measured during the rotation at the low speed of the second rotation speed V2 so that the necessity of supply and the supply positions of the dry gas and the solvent gas may be controlled based on the measurement result.

Figure 14:
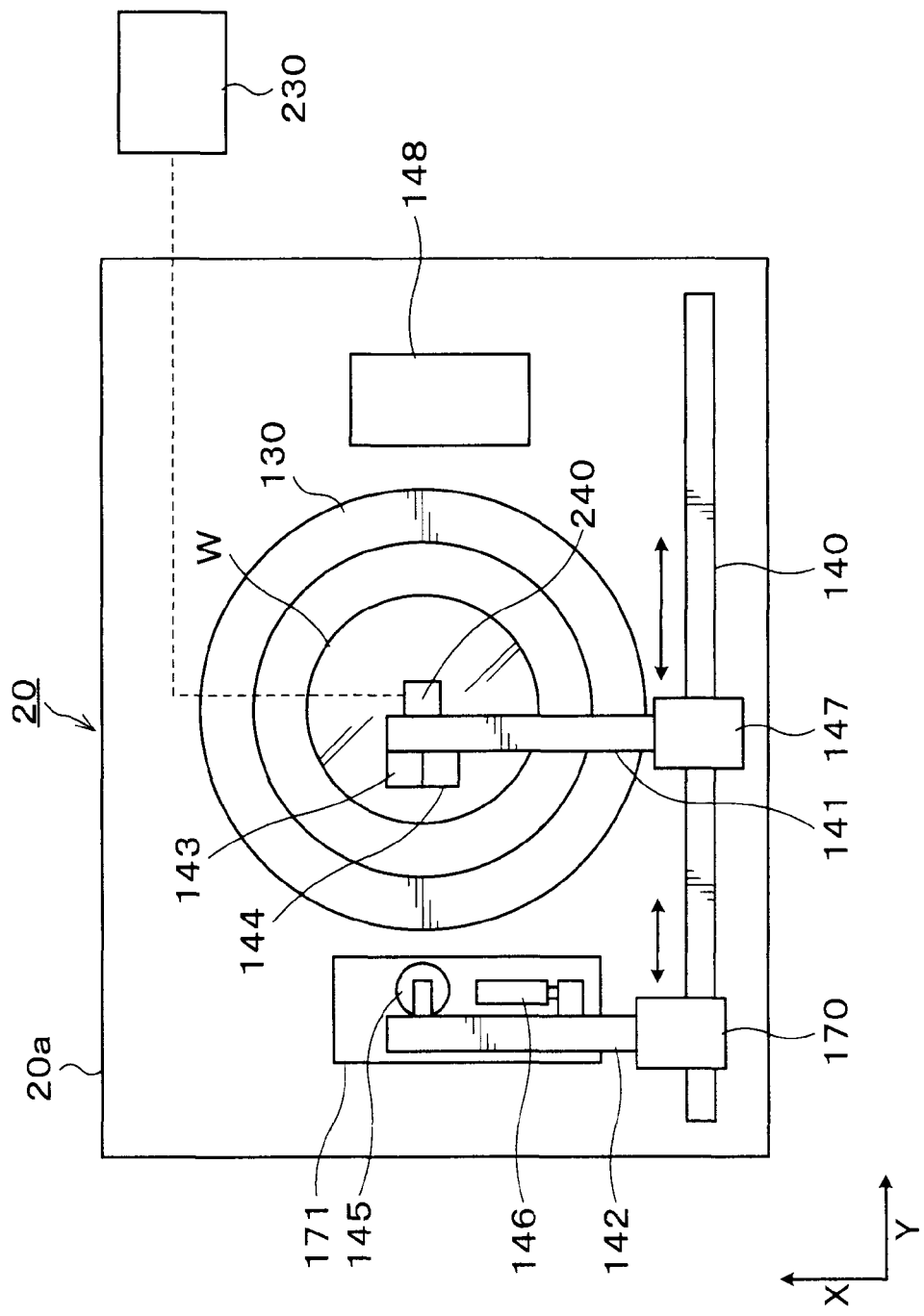
FIG. 14 is a plan view showing the outline of the configuration of the resist coating unit with a thickness measurement sensor.

In this case, for example, for example, a thickness measurement sensor 240 as a thickness measurement member is provided on the first arm 141 as shown in FIG. 14. The thickness measurement sensor 240 is attached, for example, to the tip in the X-direction of the first arm 141 and can move above the diameter of the wafer W due to movement of the first arm 141 in the Y-direction. The measurement result of the thickness of the resist solution by the thickness measurement sensor 240 can be outputted, for example, to the control unit 230. The control unit 230 can grasp the thickness of the resist solution within the wafer based on the thickness measurement result to grasp a thicker portion and a thinner portion than the set thickness, and can set the necessity of supply and the supply positions of the dry gas and the solvent gas by the central portion supply nozzle 145 and the outer peripheral portion supply nozzle 146. Further, the control unit 230 can control the operations of the central portion supply nozzle 145 and the outer peripheral portion supply nozzle 146 based on the setting.

In the coating treatment process, the wafer W is rotated at the first rotation speed V1 similarly to the above-described embodiment, and the resist solution is supplied to the wafer W from the resist solution supply nozzle 143. The wafer W is then decelerated to the second rotation speed V2, whereby the resist solution is smoothed. In this event, the thickness measurement sensor 240 is moved by the first arm 11 from the position above the central portion of the wafer W toward a position above the outer peripheral portion to measure the thickness of the resist solution on the radius of the wafer W.

The measurement result is outputted to the control unit 230, where the thickness of the resist solution within the wafer is grasped so that the positions on the wafer W to which the dry gas and the solvent gas should be supplied are set.

When the rotation of the wafer W is accelerated from the second rotation speed V2 to the third rotation speed V3, the control unit 230 allows, base on the measurement result, the central portion supply nozzle 145 and/or the outer peripheral portion supply nozzle 146 to supply the dry gas and/or the solvent gas to the wafer W. In this event, the central portion supply nozzle 145 and/or the outer peripheral portion supply nozzle 146 are/is used to supply the solvent gas to a portion of the resist solution thicker than the set thickness and the dry gas to a portion of the resist solution thinner than the set thickness as in the above embodiment. Thereafter, the rotation of the wafer W is accelerated from the third rotation speed V3 to the fourth rotation speed V4, whereby the resist solution is dried to form a resist film.

According to this example, since the thickness measurement sensor 240 actually measures the thickness of the resist solution and the dry gas and the solvent gas are supplied to the resist solution based on the measurement result, the thickness of the resist solution can be made uniform surely and accurately.

Figure 15:
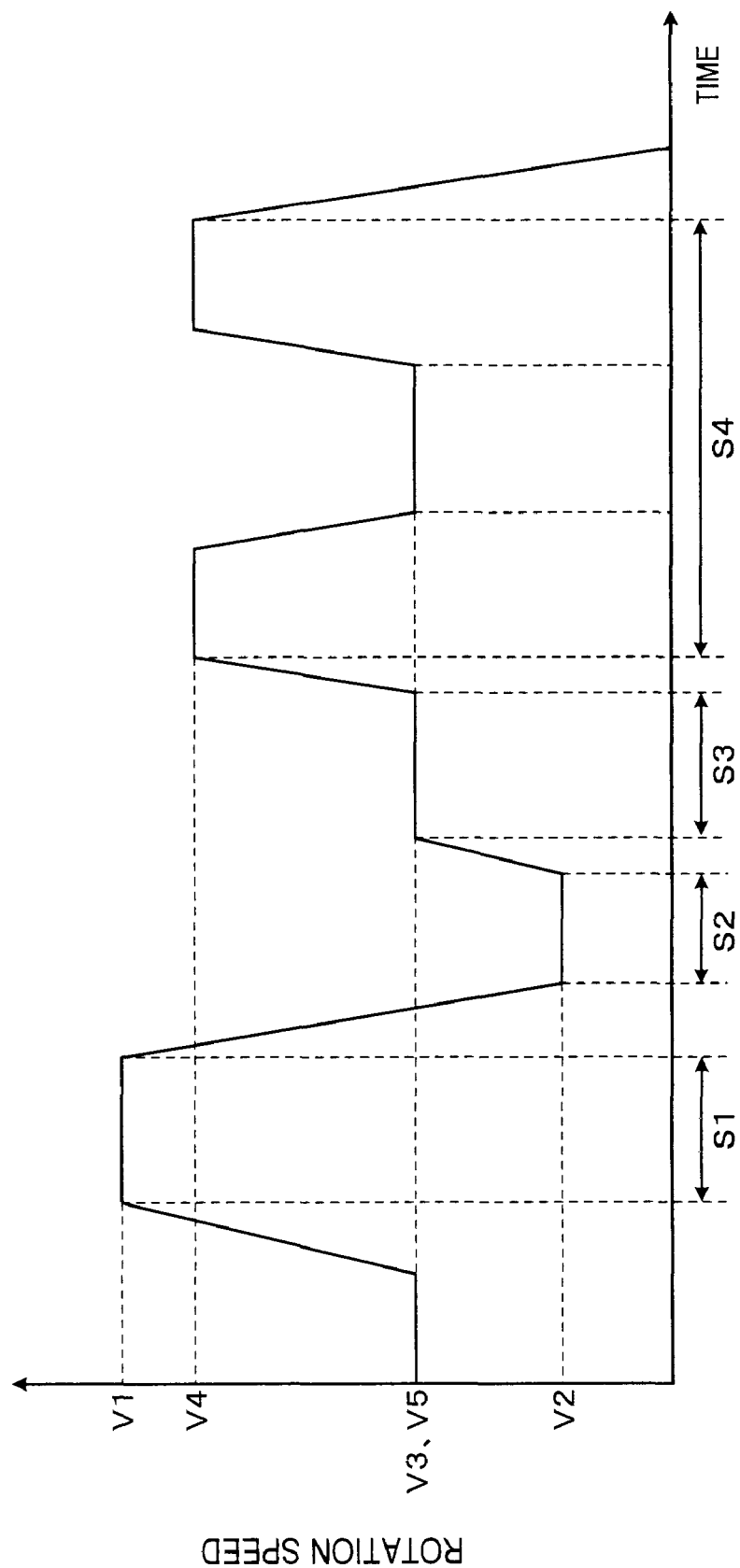
FIG. 15 is a graph showing changes in rotation speed of the wafer during the resist coating treatment when the rotation speed of the wafer is temporarily decreased at the fourth step.

At the fourth step S4 in which the resist solution on the wafer W is dried as described in the above embodiment, the solvent gas may be supplied to the thicker portion of the resist solution on the wafer W. During the supply of the solvent gas, the rotation of the wafer W may be temporarily decelerated. In this case, for example, the rotation of the wafer W is temporarily decelerated from the fourth rotation speed V4 to a fifth rotation speed V5 of about 500 rpm at the fourth step S4 as show in FIG. 15. Then, the solvent gas is supplied from the central portion supply nozzle 145 or the outer peripheral portion supply nozzle 146 to the thicker portion of the resist solution. According to this example, even when, for example, a local rise of the resist solution occurs during dry of the wafer W, for example, at the fourth step S4, the rise of the resist solution can be removed. As a result, a more uniform resist film can be finally formed.

A preferred embodiment of the present invention has been described above with reference to the accompanying drawings, but the present invention is not limited to the embodiment. It should be understood that various changes and modifications within the scope of the spirit as set forth in claims are readily apparent to those skilled in the art, and those should also be covered by the technical scope of the present invention.

Although the dry gas is introduced into the liquid solvent in the solvent storage units 182 and 212 so that the solvent mixes into the dry gas to produce the solvent gas as the method of producing the solvent gas in the above embodiment, the dry gas may be passed through a carburetor for the liquid solvent to produce the solvent gas.

In supplying the solvent gas, the solvent gas may be supplied after the concentration of the solvent in the solvent gas is adjusted. This enables finer control in removal of the local rise of the resist solution. To perform such a concentration adjustment, it is only necessary to control, for example, the flow rate and the temperature of the dry gas to be supplied to the solvent storage units 182 and 212. Specifically, it can be proposed to adjust the opening/closing degree of the valves 185 and 215 and to provide a heating apparatus and a cooling apparatus in the dry gas supply sources 180 and 211. A heating apparatus may be provided in the solvent storage units 182 and 212 to control the evaporation rate of the solvent.

Furthermore, when the dry gas is supplied, the temperature of the dry gas to be supplied to the wafer W may be controlled. This makes it possible to more finely control the degree to which the flowability is decreased. To control the temperature of the dry gas, it can be proposed to provide a heating apparatus and a cooling apparatus in the dry gas supply sources 180 and 211, or a heating apparatus and a cooling apparatus in the supply pipes 181 and 210 to heat and cool the gases in the supply pipes.

Figure 16:
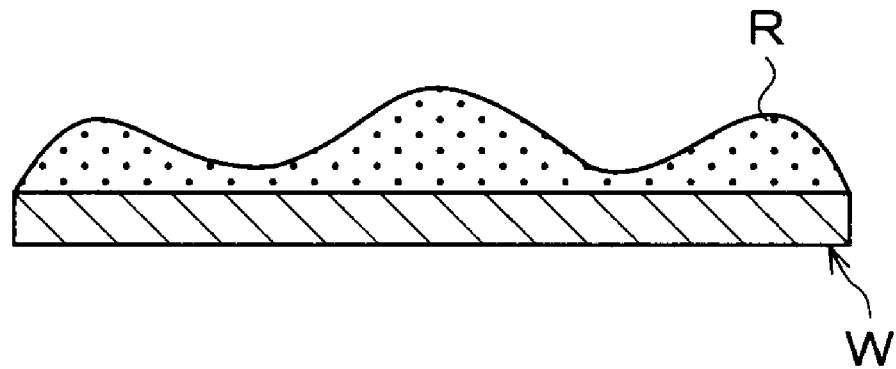
FIG. 16 is a vertical-sectional view of the wafer when a plurality of projections and depressions appear in the resist solution from the central portion to the outer peripheral portion.

Although the solvent gas is supplied as the solvent in the above embodiment, a liquid solvent or a solvent mist may be supplied. Further, although the number of nozzles for supplying the solvent gas and the dry gas is two in the above embodiment, and the number may be one or three or more. Although the present invention has been described taking the case where the resist solution R on the central portion of the wafer W rises as shown in FIG. 12 and the case where the resist solution R on the outer peripheral portion of the wafer W rises as shown in FIG. 13 as examples in the above embodiment, the present invention is also applicable to a case where the resist solution R repeatedly projects and depresses a plurality of times from the central portion to the outer peripheral portion of the wafer W as shown in FIG. 16.

While the present invention has been described taking the coating treatment of the resist solution as an example in the above embodiment, the present invention is also applicable to the coating treatment of coating solutions, other than the resist solution, for example, for an anti-reflection film, an SOG (Spin On Glass) film, an SOD (Spin On Dielectric) film, and so on. Further, although the above embodiment is an example of performing the coating treatment on the wafer W, the present invention is also applicable to the coating treatment of substrates, other than the wafer, such as a glass substrate for an FPD (Flat Panel Display), a mask reticle for a photomask, and the like.

The present invention is useful in forming a uniform coating film within a substrate.

What is claimed is:

1. A substrate coating treatment apparatus, comprising
    a rotary holding unit for holding and rotating a substrate;
    a first nozzle for supplying a coating solution onto the substrate;
    a second nozzle for selectively supplying a solvent for the coating solution and a dry gas onto the substrate;
    a thickness measurement member for measuring the thickness of the coating solution within the substrate;
    a first moving mechanism for moving said first nozzle and said thickness measurement member to a predetermined position above the substrate; and
    a second moving mechanism for moving said second nozzle to a predetermined position above the substrate wherein said first nozzle and said thickness measurement member are provided on a same support member, and
    wherein said coating treatment apparatus further comprises a control unit configured to control said first moving mechanism and said first nozzle to move said first nozzle to a position above a central portion of the substrate and then to apply a coating solution onto the central portion of the rotated substrate, and then to control said first moving mechanism and said thickness measurement member in order to move said thickness measurement member from the position above the central portion of the substrate toward a position above an outer peripheral portion while the substrate is being rotated to measure the thickness of the coating solution on a radius of the substrate.

2. A substrate coating treatment apparatus, comprising
a rotary holding unit for holding and rotating a substrate;
a first nozzle for supplying a coating solution onto the substrate;
a second nozzle for selectively supplying a solvent for the coating solution and a dry gas onto the substrate;
a moving mechanism for moving said second nozzle to a predetermined position above the substrate,
wherein said second nozzle comprises a central portion supply nozzle for selectively supplying the solvent for the coating solution and the dry gas to a central portion of the substrate, and an outer peripheral portion supply nozzle for selectively supplying the solvent for the coating solution and the dry gas to an outer peripheral portion around the central portion of the substrate; and
a control unit programmed to cause said central portion supply nozzle to supply one of the solvent for coating solution and the dry gas to the central portion of substrate while the outer peripheral portion supply nozzle simultaneously supplies the other of the solvent for coating solution and the dry gas to the outer peripheral portion of the substrate.

3. The coating treatment apparatus as set forth in claim 2, wherein said central portion supply nozzle and said outer peripheral portion supply nozzle are supported on a same support member capable of moving from outside of the substrate to a position above the substrate.

4. The coating treatment apparatus as set forth in claim 3, wherein said support member is provided with a horizontal drive unit for horizontally moving said outer peripheral portion supply nozzle along a direction of a radius of the substrate.

5. The coating treatment apparatus as set forth in claim 2, further comprising:
a thickness measurement member for measuring the thickness of the coating solution within the substrate.

6. The coating treatment apparatus as set forth in claim 2, further comprising:
a temperature controller for controlling the temperature of the solvent and/or the dry gas.

* * * * *